(12) United States Patent
Beroz

(10) Patent No.: US 6,972,473 B2
(45) Date of Patent: Dec. 6, 2005

(54) STRUCTURE AND METHOD OF MAKING AN ENHANCED SURFACE AREA CAPACITOR

(75) Inventor: Masud Beroz, Livermore, CA (US)

(73) Assignee: Tessera, Inc., San Jose, CA (US)

( * ) Notice: Subject to any disclaimer, the term of this patent is extended or adjusted under 35 U.S.C. 154(b) by 5 days.

(21) Appl. No.: 10/639,086

(22) Filed: Aug. 12, 2003

(65) Prior Publication Data

US 2005/0035390 A1 Feb. 17, 2005

(51) Int. Cl.[7] ............................................. H01L 29/00
(52) U.S. Cl. ........................ 257/528; 257/532; 361/500
(58) Field of Search ................................. 438/240, 253, 438/255, 398; 361/500, 523, 541, 525, 434

(56) References Cited

U.S. PATENT DOCUMENTS

| | | | |
|---|---|---|---|
| 3,962,713 A | | 6/1976 | Kendall et al. |
| 4,780,796 A | * | 10/1988 | Fukuda et al. ............... 361/525 |
| 5,149,676 A | * | 9/1992 | Kim et al. ................... 438/398 |
| 5,166,904 A | | 11/1992 | Hazani |
| 5,461,537 A | * | 10/1995 | Kobayashi et al. .......... 361/525 |
| 6,124,769 A | * | 9/2000 | Igarashi et al. ............. 333/172 |
| 2003/0116348 A1 | * | 6/2003 | Nakatani et al. ............ 174/260 |

* cited by examiner

Primary Examiner—Tuan H. Nguyen
(74) Attorney, Agent, or Firm—Lerner, David, Littenberg, Krumholz & Mentlik, LLP

(57) ABSTRACT

As disclosed herein, a capacitor structure and method are provided to enhance plate surface area to provide increased capacitance. The capacitor structure includes a base which includes a surface having an m×n array of upwardly or downwardly extending features, or a combination of upwardly and downwardly extending features, where m and n are each at least two. In addition, a first plate of the capacitor includes a first conductive layer which conforms to the contours of the surface. The capacitor also includes a conformal capacitor dielectric layer placed over the conformal conductive layer. When the capacitor is an electrolytic capacitor, the structure of the first plate and capacitor dielectric layer is contacted by an electrolyte. When the capacitor is a plate capacitor, a second plate including a second conductive layer is placed over the conformal capacitor dielectric layer. In addition, a method is disclosed for fabricating a capacitor having increased capacitance, by greatly increasing the surface area of a conductive plate of the capacitor.

29 Claims, 9 Drawing Sheets

STRUCTURE AND METHOD OF MAKING AN ENHANCED SURFACE AREA CAPACITOR

BACKGROUND OF THE INVENTION

In microelectronics manufacturing today, more function is being packed into ever smaller spaces, often with attendant increases in operational speed, and power consumption per unit volume. In addition, some integrated circuits are being manufactured at much larger die sizes than only a few years ago. At such higher speeds, higher power consumption, and larger sizes, relatively large value capacitors are needed in small spaces to satisfy what can be quite local needs, such as for decoupling of signals on the integrated circuit chip, and decoupling of signals transferred onto and off of the chip. Moreover, it is desirable to locate capacitors as close as possible to the sites they are needed, because the conductors which connect capacitors to the sites of interest have inductance, which can provide significant impedance to counteract the capacitor action at frequencies of interest. In such environment, it has become important to provide a small-size, large value capacitor for placement as near as possible to the site requiring the capacitance, to facilitate operation of integrated circuits and associated circuitry, including integrated circuit packaging and printed circuit boards.

A diagram illustrating a simple plate capacitor is provided in FIG. 1A. It is known that the capacitance C of a capacitor having two parallel conductive plates 1 and 2 of the same size is determined by the equation $$C = K * A / d$$

where A is the area of one of the conductive plates, d is the distance separating the two capacitor plates, and K is the dielectric constant of the dielectric material that fills the space between the two plates. Therefore, in order to provide a capacitor having higher capacitance, either the dielectric constant must be increased, the distance between plates made smaller, or the area of capacitor plates be enlarged.

Increasing the dielectric constant of a plate capacitor is difficult to do because it requires replacing the dielectric material with a different dielectric material that has a higher dielectric constant. The new material has to be integrated into a processing scheme, which requires that it be compatible with the materials used as the conductive plates and electrodes of the capacitor, and be capable of undergoing all of the particular processing that the capacitor structure ordinarily undergoes. Decreasing the separating distance d between plates is also problematic because that too is a matter which is largely determined by the choice, in a particular capacitor fabrication process, of the particular dielectric material, in view of its behavior during deposition, and any processing and design tolerances which are necessary to ensure reliable operation after manufacture.

In an electrolytic capacitor, there is even less control over the dielectric material that is used and its thickness. As illustrated in FIG. 1B, an electrolytic capacitor includes conductive plate 3 which is separated from an electrolyte fluid 4 by a capacitor dielectric 5. The electrolyte fluid is placed in a conductive vessel 6, to which an external terminal of the capacitor is connected. Thus, electrolytic capacitors have only one conductive plate. In some electrolytic capacitors, a native oxide forms to a final thickness when the plate is placed in the electrolyte, the native oxide functioning as of a capacitor dielectric. In such cases, the choice of dielectric material and its thickness are entirely determined by the choice of metal for the conductive plate.

Since the above difficulties prevent the capacitance of a capacitor from being increased by choice of dielectric materials and/or change in the plate-separating distance d, it follows that a more effective way to increase capacitance is to increase the surface area available to the capacitor as a plate.

SUMMARY OF THE INVENTION

One aspect of the invention provides a structure of a capacitor having enhanced surface area. The capacitor includes a base which includes a surface having an m×n array of upwardly or downwardly extending features, or a combination thereof, where m and n are each at least two. In addition, a first plate of the capacitor includes a first conductive layer, and conforms to the contours of the surface. The capacitor also includes a conformal capacitor dielectric layer located over the conformal conductive layer. Such structure can be placed in an electrolyte to form an electrolytic capacitor. When the capacitor is a plate capacitor, a second plate that includes a second conductive layer is placed over the conformal capacitor dielectric.

Another aspect of the invention provides a method of making a capacitor having an enhanced plate surface area. The method includes providing a mandrel including a surface having an m×n array of features extending at least one of upwardly and downwardly. A conformal first conductive layer is formed over the mandrel which conforms to contours of the surface. A conformal capacitor dielectric layer is formed over the first conductive layer. When the capacitor is an electrolytic capacitor, the dielectric layer can be formed as a native oxide of the conformal first conductive layer. Alternatively, a dielectric material other than a native oxide of the first conductive layer can be deposited. To form an electrolytic capacitor, the structure including the first conductive layer and the capacitor dielectric layer is contacted by an electrolyte contained within a vessel.

When it is desired to form a plate capacitor, a second conductive layer is formed over the conformal capacitor dielectric layer, such that a capacitor is formed which includes a first plate comprising the conformal first conductive layer, a capacitor dielectric comprising the conformal capacitor dielectric layer, and a second plate comprising the second conductive layer.

DETAILED DESCRIPTION OF THE PREFERRED EMBODIMENTS

Accordingly, a capacitor having an enhanced surface area, and a method for making the same are provided by the present invention. These are described in the embodiments provided herein as follows.

Figure 2A:
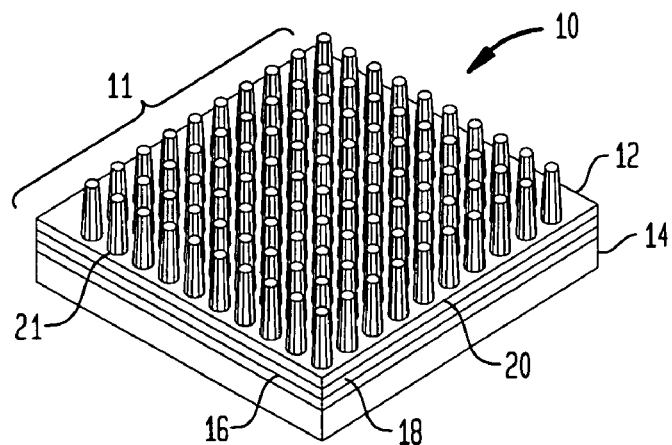
FIG. 2A is a perspective drawing illustrating an enhanced surface area capacitor structure according to a first embodiment of the invention.

FIG. 2A illustrates a first embodiment of a capacitor structure 10 in which at least one plate of the capacitor has a surface provided with an m by n array 11 of upwardly extending features 12. Preferably, the features have conical shape and a high ratio of height to cross-section (aspect ratio). By providing a large number of closely packed vertically extending features in a small area, great increases, e.g. up to 100 fold or more in surface area can be obtained. As shown in FIG. 2A, capacitor 10 includes a base 14 having a surface including an m by n array of upwardly extending features 12. A first conformal conductive layer 16 and a capacitor dielectric layer 18 are placed over the surface and features of the base 14.

When the capacitor is an electrolytic capacitor, such structure including base 14, the plate formed by the first conformal conductive layer 16 and the capacitor dielectric layer 18 are placed in an electrolyte contained in a vessel, with the plate 16 forming the anode (higher voltage side) of the capacitor, and the electrolytic solution forming the cathode which has a conductive path to a lower voltage or ground through the vessel. Electrolytic capacitors provide large capacitance only when they remain connected in such way, with the metal capacitor plate 16 always at a higher voltage than the anode, in which case the direction of current flow remains essentially the same.

If the circuit calls for voltages on the capacitor terminals to switch between positive and negative values, however, a plate capacitor is needed, because the electrolytic capacitor would be damaged by a negative voltage from the anode to the cathode. When the capacitor is a plate capacitor, which is formed by two essentially parallel plates having a dielectric layer between them, a second conductive layer 20 is formed over the capacitor dielectric layer 18. As an option, one or more additional capacitor dielectric layers (not shown) and one or more additional conductive layers may be formed, respectively, over second conductive layer 20, to form a multiple layer capacitor structure. In the description of the invention to follow, frequent reference will be made to plate capacitors, with the understanding, however, that electrolytic capacitors are formed by similar processes, the differences having been indicated above.

In the particular embodiment shown in FIG. 2A, a plurality of upwardly extending features 21 in the shape of pyramidal or conical frustums are provided in an m by n array in which the numbers m and n are the same. The numbers m and n of features, which define the size of the array of features, are both greater than or equal to two. Many different array sizes and shapes can be implemented by varying the value of m and n.

Figure 2B:
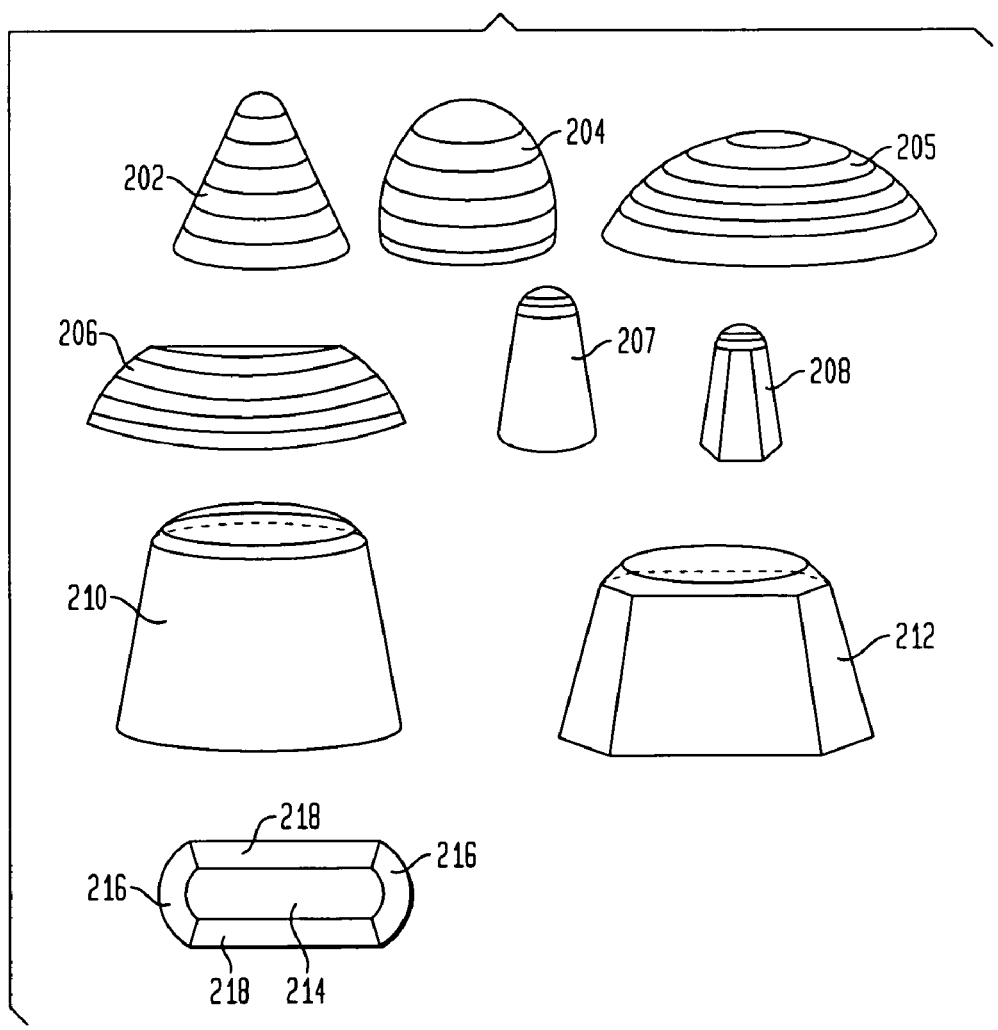
FIG. 2B is a diagram illustrating exemplary shapes to which features of an enhanced surface area capacitor may be formed.

Moreover, the features are not limited to a particular shape. In the embodiment shown in FIG. 2A, features 12 have the shape of pyramidal or conical frustums (sections of pyramids or cones that lie between two planes). However, as indicated by the exemplary shapes set forth in FIG. 2B, many shapes are available for the fabrication of features 12. Such shapes are provided only as examples for fabricating features 12. The shapes with which features 12 are formed are by no means limited to these examples.

Generally, surfaces of revolution about an axis provide appropriate shapes for features 12, as well as do polyhedrons which approximate such surfaces of revolution, or which are otherwise processed, preferably, such that sharp corners are rounded somewhat at the junction between the planar surfaces of a polyhedron. An example of a surface of revolution about an axis is a paraboloid of revolution 202. Other examples of shapes of features 12 include a spheroidal cap 204, which may either be prolate (as shown here) or oblate. Other somewhat similar shapes are a spherical cap (not shown) such as a hemisphere, which is similar to the spheroidal cap except that it has uniform radius in every direction, an ellipsoidal cap 205, and a spherical segment 206, which is the portion of a sphere lying between two planes. In other examples, the shapes 207, 208 are formed by adding spherical caps or spherical segments to the tops of conical or pyramidal frustums that are described above with reference to FIG. 2A. As another example, cones having very low height, or frustums in which the radius decreases rapidly with height, could be formed on top of the frustums found in lower portions of shapes 207, 208. Another example of a shape useful for forming features 12 is an elliptic conical frustum 210, which may or may not be formed with a cap, such as an ellipsoidal cap. As another example, an elliptic pyramidal frustum 212 is shown, which may or may not be formed with an ellipsoidal cap. As also shown in a top-down view in FIG. 2B, a feature 214 having elongated straight sides may be provided with surfaces 216 of partial revolution or semi-revolution about an axis, for example, segments of frustums, at its ends, while surfaces 218 on the sides of the feature 214 remain essentially trapezoidal. This description of shapes for forming features 12 is provided by way of illustration, and is by no means exhaustive.

However, if the features include corners having sharp radii, for example, when they are rectangular in cross-section, the corners of each feature should be rounded, rather than remain at an abrupt angle, to avoid locally high electric fields in the corners, which could cause breakdown and failure of the capacitor dielectric layer. Electropolishing can be used to round sharp corners of features. Many other array shapes can be implemented, and the features need not extend upwardly, but rather, can extend downwardly from the surface of the base 14. A few such alternative embodiments are illustrated in FIGS. 2C through 5.

Figure 2C:
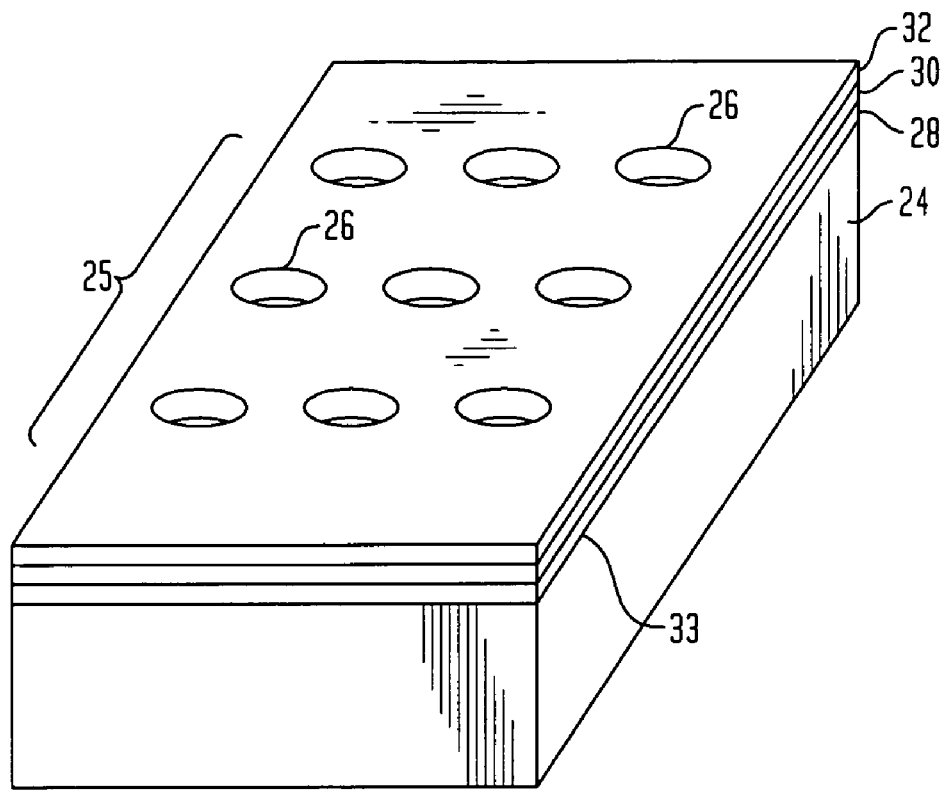
FIG. 2C is a perspective drawing illustrating an enhanced surface area capacitor structure according to a second embodiment of the invention.

FIG. 2C illustrates an embodiment of the invention in which a capacitor is formed having a base 24 that includes an m by n array 25 of features 26 which extend downward from the surface of the base 24. Downward extending features 26 are, thus, depressions in the surface 33 of the base 24. Such depressions can be generally cylindrical in cross-section where they meet with the exterior surface 33 of the base 24. Many other shapes are possible, examples of which are provided in FIG. 2B, such shapes being inverted to define the shapes of depressions 26. As an example, depressions 26 can have oblong or generally rectangular cross-section where they meet with the surface 33 of the base 24. However, if the depressions 26 are generally rectangular in cross-section, the corners of each rectangular depression should be rounded, rather than at an abrupt angle, to avoid locally high electric fields in the corners, which could cause breakdown and failure of the capacitor dielectric layer. As in the embodiment shown in FIG. 2A, in a plate capacitor embodiment, a first conformal conductive layer 28, a capacitor dielectric layer 30, and a second conductive layer 32 are formed over the base 24 having the m by n array 25 of features 26. As in the embodiment described above relative to FIG. 2A, the numbers m and n of features, which define the size of the array of features, are both greater than or equal to two, and additional capacitor dielectric layer(s) and additional conductive layer(s) can be formed over the second conductive layer 32 to form a multiple layer capacitor structure, if desired.

Figure 3:
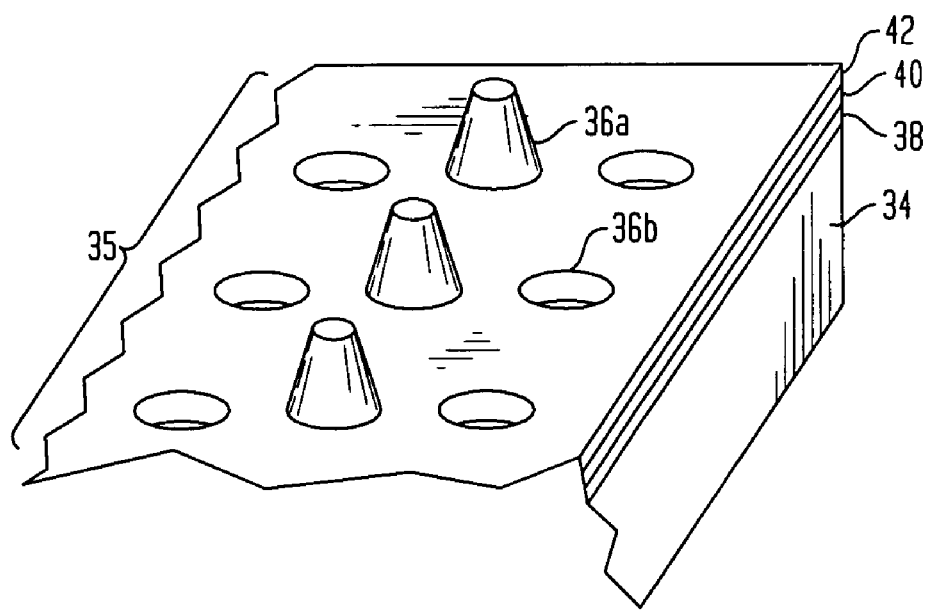
FIG. 3 is a perspective drawing illustrating an enhanced surface area capacitor structure according to a third embodiment of the invention.

FIG. 3 illustrates another embodiment of the invention, in which a capacitor includes a base 34 having an m by n array 35 of features, in which some features 36a extend upwardly, and other features 36b extend downwardly, as depressions in the surface of the base 34. As in the embodiment shown in FIG. 2A in a plate capacitor embodiment, a first conformal conductive layer 38, a capacitor dielectric layer 40, and a second conductive layer 42 are formed over the base 34 having the m by n array 35 of features 36. Additional capacitor dielectric layer(s) and conductive layer(s) can be provided over the second conductive layer 42 to form a multiple layer capacitor, if desired. As in the embodiment described above relative to FIG. 2A, the numbers m and n of features, which define the size of the array of features, are both greater than or equal to two.

Figure 4A:
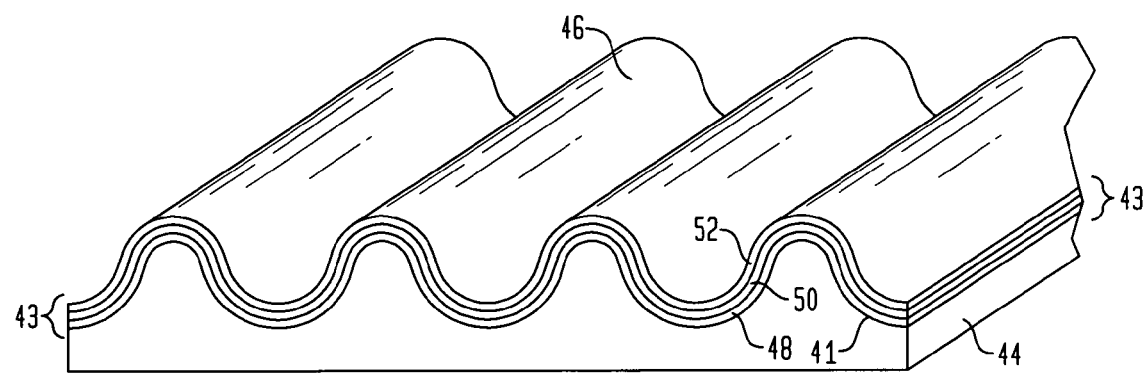
FIGS. 4A and 4B are a perspective drawing, and a top-down view, respectively, illustrating an enhanced surface area capacitor structure according to a fourth embodiment of the invention.
Figure 4B:
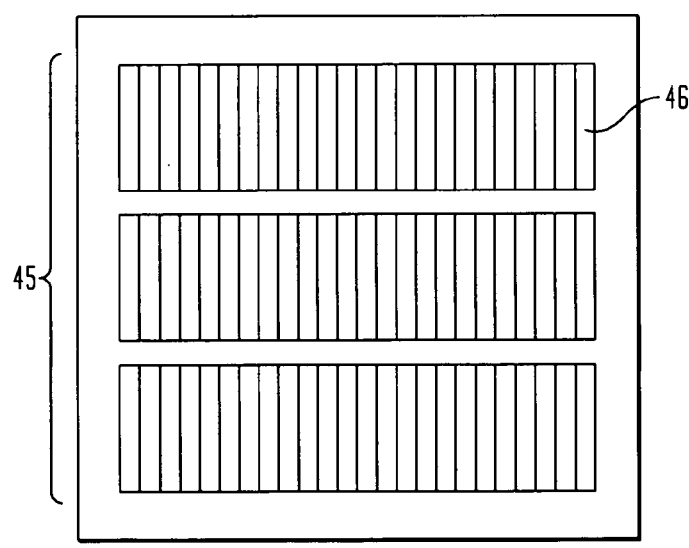

FIGS. 4A and 4B are a perspective drawing, and a top-down view, respectively, illustrating another embodiment of the invention in which a plate capacitor 43 is formed having a base 44 which includes an m by n array 45 (FIG. 4B) of features 46 in the shape of ridges which extend upwardly from the surface 41 of the base 44. The ridge-shaped features 46 can be elongated, as shown in FIGS. 4A and 4B, and generally parallel in orientation, for ease of fabrication and to pack a large number of ridges into an allotted space. As shown in FIG. 4A, the ridges 46 are preferably smooth and rounded in shape, for example, sinusoidal in shape, rather than having rectilinear corners and edges between surfaces, to avoid locally high electric fields arising at such corners which could cause breakdown and early failure of the capacitor dielectric layer. As in the embodiment shown in FIG. 2A, in a plate capacitor embodiment, a first conformal conductive layer 48, a capacitor dielectric layer 50, and a second conductive layer 52 are formed over the base 44 having the m by n array 45 of ridge-shaped features 46 and additional capacitor dielectric layer(s) and conductive layer(s) can be provided to form a multiple layer capacitor, if desired. As in the embodiment described above relative to FIG. 2A, the numbers m and n of features, which define the size of the array of features, are both greater than or equal to two.

Figure 5A:
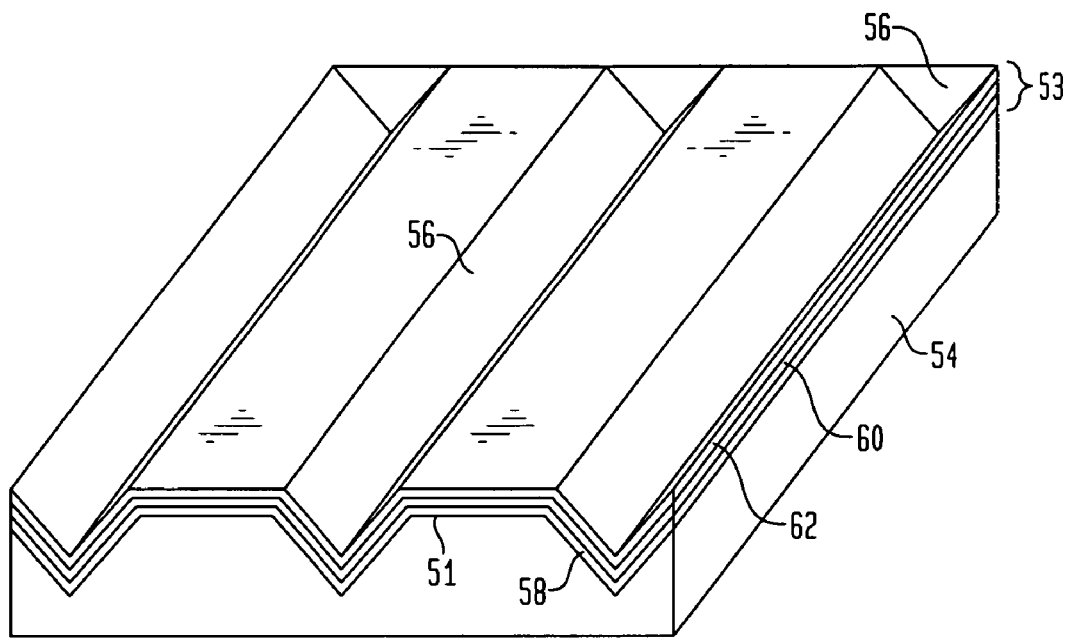
FIGS. 5A and 5B are a perspective drawing, and a top-down view, respectively, illustrating an enhanced surface area capacitor structure according to a fifth embodiment of the invention.
Figure 5B:
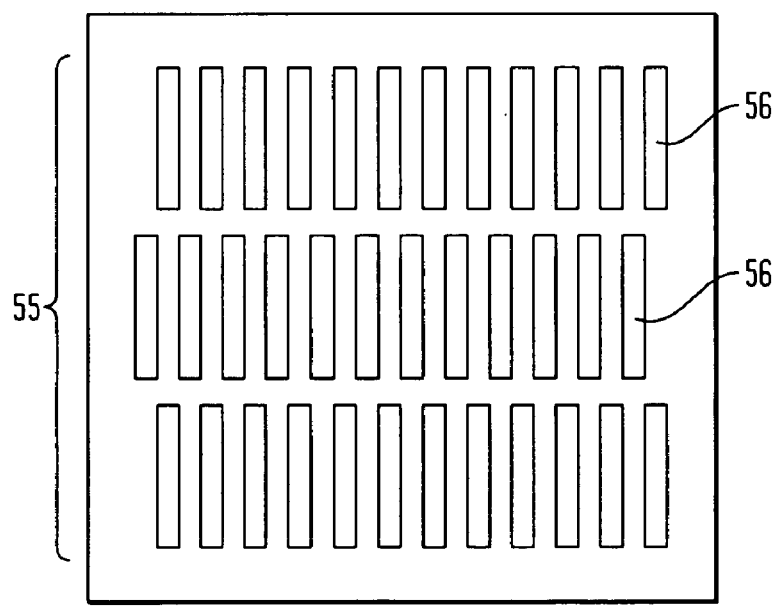

FIGS. 5A and 5B are a perspective drawing, and a top-down view, respectively, illustrating another embodiment of the invention in which a capacitor 53 is formed having a base 54 which includes an m by n array 55 of features 56 in the shape of troughs which extend downwardly from the surface 51 of the base 54. The trough-shaped features 56 can be elongated, as shown in FIGS. 5A and 5B, and are preferably generally parallel in orientation, for ease of fabrication and to maximize the number of troughs packed into the allotted space. As shown in FIG. 5A, the troughs 56 are preferably smooth and rounded in shape, rather than having rectilinear corners and edges between surfaces, to avoid locally high electric fields arising at such corners, which could cause breakdown and failure of the capacitor dielectric layer. As in the embodiment shown in FIG. 2A, in a plate capacitor embodiment, a first conformal conductive layer 58, a capacitor dielectric layer 60, and a second conductive layer 62 are formed over the base 54 having the m by n array 55 of trough-shaped features 56. As in the embodiment described above relative to FIG. 2A, the numbers m and n of features, which define the size of the array of features, are both greater than or equal to two.

Next, a first method embodiment of fabricating a capacitor according to any of the above-described structural embodiments is described, referring to FIGS. 6 through 14. In this embodiment, a capacitor is formed on the surface of a mandrel, which is preferably reusable, such that after the capacitor is fully formed, it is then removed from the mandrel, and the mandrel is then free to be used in fabricating another capacitor. The description of fabricating a capacitor according to this embodiment begins by describing the way in which a reusable mandrel is fabricated.

Figure 6:
FIGS. 6 through 9B are cross-sectional drawings illustrating steps in a method for fabricating a mandrel or a capacitor base having enhanced surface area, as a tool that may be used in fabricating an enhanced surface area capacitor according to a first method embodiment of the invention.

As shown in FIG. 6, a generally planar substrate 100 is provided, which is shaped, through processing, into a mandrel upon which a capacitor will be formed. In an embodiment, substrate 100 can be formed of a single crystal semiconductor or, alternatively, polycrystalline semiconductor, for which processes are well-developed for photolithographic patterning and anisotropic, directional etching to small dimensions. Alternatively, substrate 100 can be formed of any material which permits anisotropic, directional etching, or machining to the dimensions required to produce the feature shapes and sizes to obtain the required capacitance. Preferably, a mandrel is formed by etching a single crystal silicon or polycrystalline silicon ("polysilicon") substrate 100.

Figure 7:
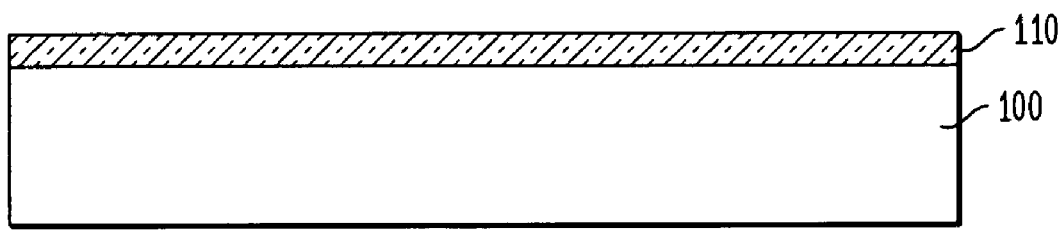
Figure 8:
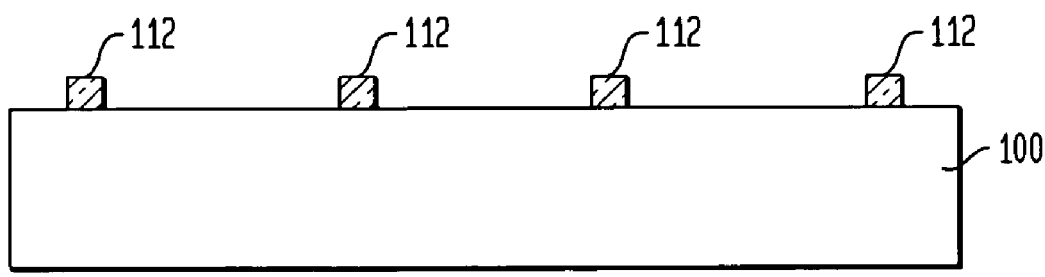

As shown in FIG. 7, a mask layer 110 is deposited over substrate 100, and then patterned, using photolithography, and/or one or more etching processes, to create a set of mask patterns 112 over the surface of substrate 100, as shown in FIG. 8. In a preferred embodiment in which substrate 100 comprises single crystal silicon or polysilicon, mask layer 110 can include a photoresist material; however, mask layer 110 preferably comprises a hardmask including one or more materials selected from the following: silicon nitride, silicon oxide, doped silicate glass including one or more of borosilicate glass (BSG), phosphosilicate glass (PSG), and borophosphosilicate glass (BPSG), such that anisotropic, vertical etching can be performed with a process such as reactive ion etch (RIE), while the hardmask patterns 112 sufficiently remain throughout the etching process.

Figure 9A:
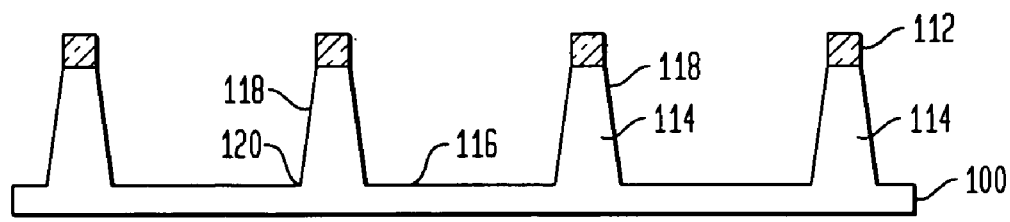

Next, as shown in FIG. 9A, the substrate 100 is etched anisotropically in the vertical direction, selective to the material of the mask patterns 112, to define protrusions 114 which extend above the surface 116 of the substrate 100. If the protrusions are not sufficiently rounded after the anisotropic etching process, various other processes such as a controlled isotropic etch, and/or electropolishing can be used to provide rounding. For best results, an anisotropic etch process is selected in which material is etched primarily perpendicular to the plane of the substrate 100; i.e., vertically. Although etching is carried out primarily in the vertical direction, the direction of the etch process is preferably not entirely vertical, such that sidewalls 118 of the protrusions 114 are somewhat sloped, and some rounding is achieved where the protrusions 114 meet the surface 116 of the substrate 100. An isotropic etch process, in which etching is uniform in all directions, is not preferred for this step because it would result in shorter protrusions 114, and possible undercut of the material of the substrate 100 under mask patterns 112, resulting in a poorly controlled process. When the substrate 100 is formed of silicon and a hardmask is used, composed of one or more of the above-noted materials, an anisotropic vertical etch process can be realized by any one of many well-known reactive ion etching (RIE) processes.

Figure 9B:
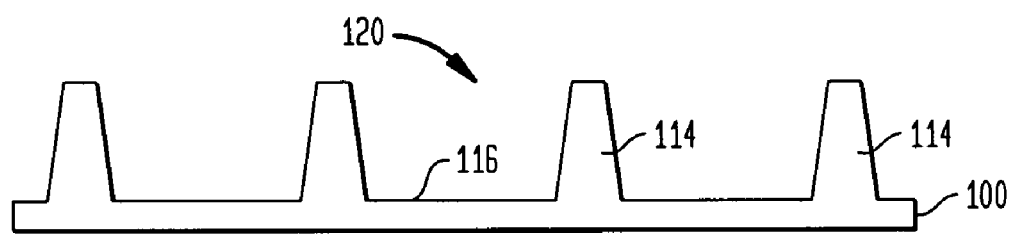

Thereafter, as shown in FIG. 9B, an etch or cleaning process is performed to remove any material of the mask patterns 112 remaining after etching substrate 100, thus determining the shape of a mandrel structure 120, as shown. The mandrel structure 120 now defines the shape of a surface for forming a capacitor structure, as will be described in the following, with reference to FIGS. 10–18. In the embodiments described below, the mandrel structure 120, formed as described above relative to FIGS. 6 through 9A, can be used as the surface itself upon which a capacitor is formed. Alternatively, a mold can be made from mandrel 120 to form a like-shaped mandrel, on which a capacitor structure is then formed. The like-shaped mandrel can thus be formed of a low-cost material such as a polymeric material. In the description which follows, mandrel 120 shall refer to either an original mandrel 120, formed by the above process described relative to FIGS. 6 through 9B, or a like-shaped mandrel formed by a mold of mandrel 120. Also at this time, mandrel 120 can be metallized and/or treated at a top surface with a low-adhesion material such as chromium, ruthenium, molybdenum stainless steel or heavily doped polysilicon to facilitate the later removal of materials deposited thereover.

Figure 10:
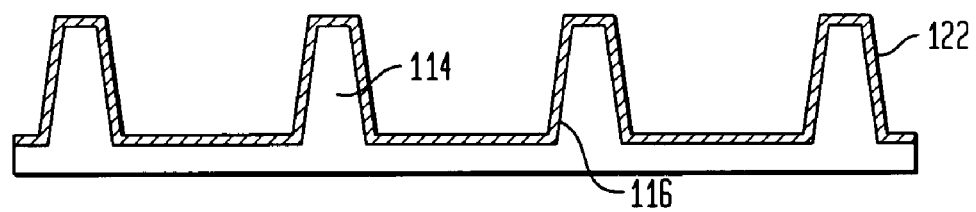
FIGS. 10 through 12 are cross-sectional drawings illustrating steps in a method of fabricating an enhanced surface area capacitor according to a first method embodiment of the invention.

The formation of a capacitor structure according to a first method embodiment, using mandrel 120, is now described with reference to FIGS. 10–14. As shown in FIG. 10, a first conformal conductive layer 122 is formed over the surface 116 of the mandrel 120, including protrusions 114. If a low adhesion material layer has not already been formed on mandrel 120, the first conductive layer 122 preferably includes a low adhesion material such as chromium, ruthenium, molybdenum stainless steel or heavily doped polysilicon in contact with the mandrel 120, to help facilitate later removal of the capacitor structure from the mandrel 120. Such low adhesion material is deposited to form a layer in contact with mandrel 120, preferably by any one of several conventional processes for chemical vapor deposition (CVD) or by sputtering, including room temperature sputtering. When it is not necessary to remove the capacitor from mandrel 120 after formation, such as when a low-cost like-shaped mandrel is used, formed from a mold of the original mandrel 120, the low adhesion material can be omitted. In either case, the first conductive layer 122 preferably includes an additional surface conductive material conformally deposited by any one of many available conventional techniques onto the low adhesion material layer, or onto the mandrel 120. Examples of such surface conductive material include but are not limited to copper, nickel, aluminum, tantalum, niobium, magnesium, titanium, tungsten, zirconium, and/or zinc, low-resistance compounds of metals, and heavily doped polysilicon.

Figure 11:
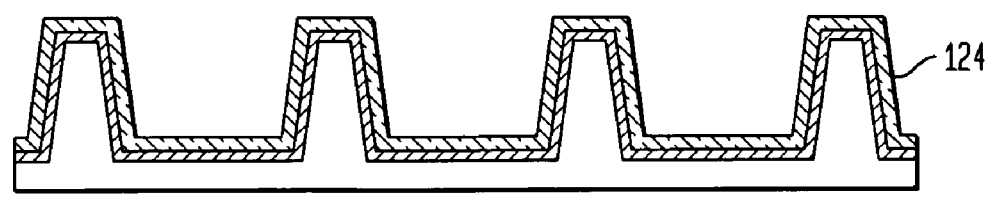

Next, as shown in FIG. 11, a capacitor dielectric layer 124 is formed. Such capacitor dielectric layer 124 is preferably formed of a material which conforms to the surface shape of the first conductive layer 122 on which it is deposited, has a preferably high dielectric constant k, and is compatible with the materials used in the conductive layers of the capacitor structure which it contacts. Preferred materials for the capacitor dielectric layer 124 include native oxides of the surface metal of the conformal first conductive layer 122, silicon dioxide, silicon nitride, and silicon oxynitride, and combinations of layers of such materials. Native oxides of the first conductive layer 122 form upon exposure to oxygen when particular metals are used therein, including but not limited to aluminum, magnesium, tantalum, titanium, niobium, zinc, and zirconium. Such process can be accelerated, if desired, by baking the structure in an oxygen atmosphere.

Figure 1A:
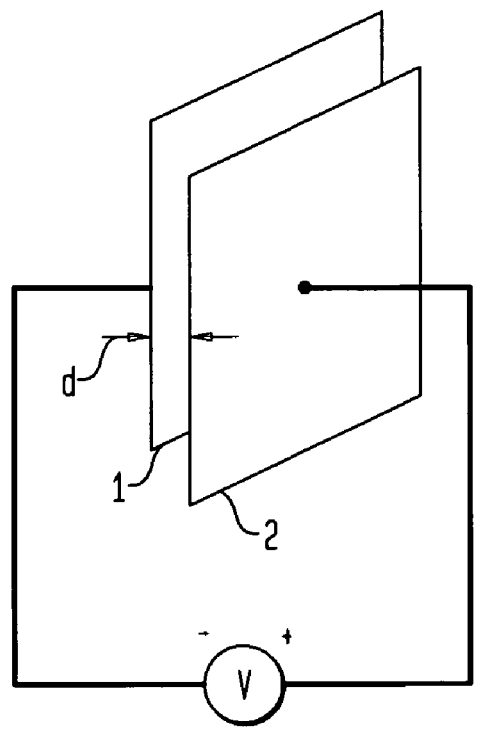
FIG. 1A is a perspective drawing illustrating a simple prior art plate capacitor.
Figure 1B:
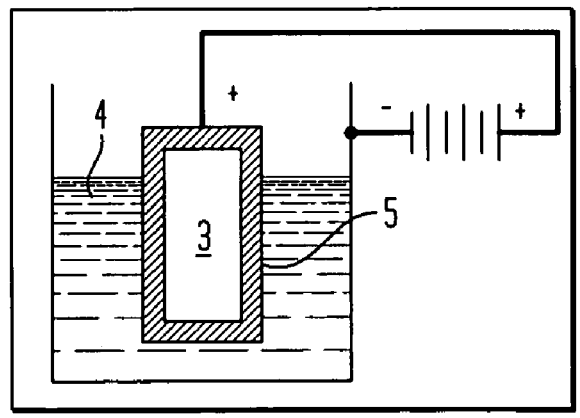
FIG. 1B is a diagram illustrating a simple prior art electrolytic capacitor.

In a particular embodiment, an electrolytic capacitor having enhanced surface area is formed by a structure of the conformal first conductive layer 122, covered by a capacitor dielectric layer 124, and supported by a mandrel or like-shaped mandrel 120, when that structure is contacted with an electrolyte, for example, an aqueous buffered acidic solution in a vessel, similar to the arrangement shown in FIG. 1B, except for the use of the enhanced surface area structure of layers 120, 122 and 124. In such embodiment, the capacitor dielectric layer 124 can be formed as a native oxide of the surface metal of the conformal first conductive layer 122, either before or after the structure is contacted with the electrolyte.

Figure 12:
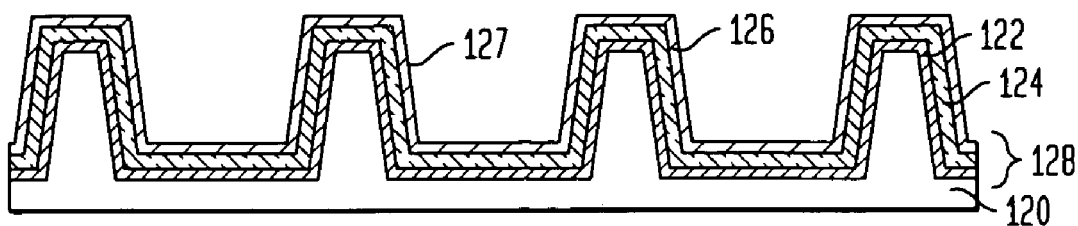

To form a plate capacitor rather than an electrolytic capacitor, additional processing is needed. As shown in FIG. 12, a second conductive layer 126 is formed over the capacitor dielectric layer 124 to form a layered stack including the conformal first conductive layer 122, capacitor dielectric layer 124, and second conductive material layer 126. The formation of second conductive material layer 126 can vary depending upon subsequent steps employed in the formation of a plate capacitor. For example, it may be desired to fabricate a capacitor having multiple capacitor dielectric layers and a corresponding number of conductive layers, in order to increase the total surface area of the capacitor. In such case, second conductive material layer 126 is preferably deposited conformally over capacitor dielectric layer 124, such that an exposed surface 127 of second conductive material layer 124 has increased surface area by conforming generally to the contours of capacitor dielectric layer 124. Thereafter, subsequent depositions of an additional capacitor dielectric layer (not shown) and an additional second conductive material layer (not shown) are performed to provide a capacitor stack having a plurality of capacitor dielectric layers, each dielectric layer being located between respective pairs of conductive layers.

However, when the capacitor is to be formed with a single capacitor dielectric layer 124, the second conductive layer 126 need not be deposited conformally, since the top surface 127 will not be used thereafter as a surface which determines the surface area of a subsequently deposited capacitor dielectric layer. In such case, the types of processes available for forming the second conductive layer 126 can be greater than those available for forming the conformal first conductive layer 122.

Figure 13:
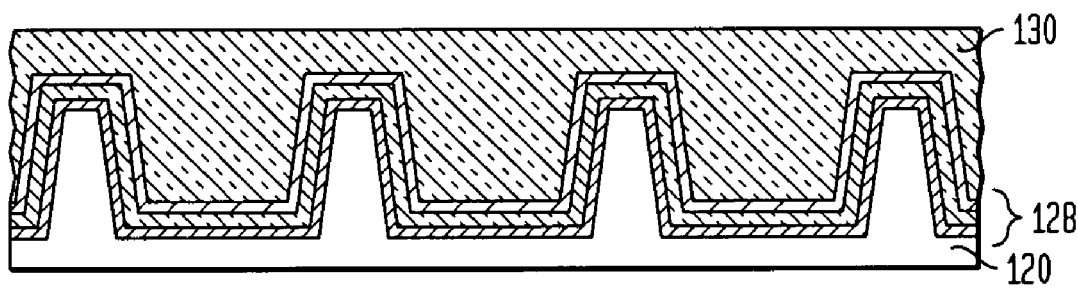
FIGS. 13 and 14 are cross-sectional drawings illustrating steps to be performed, subsequent to those illustrated in FIGS. 6 through 12, according to an alternative method embodiment of the invention.
Figure 14:
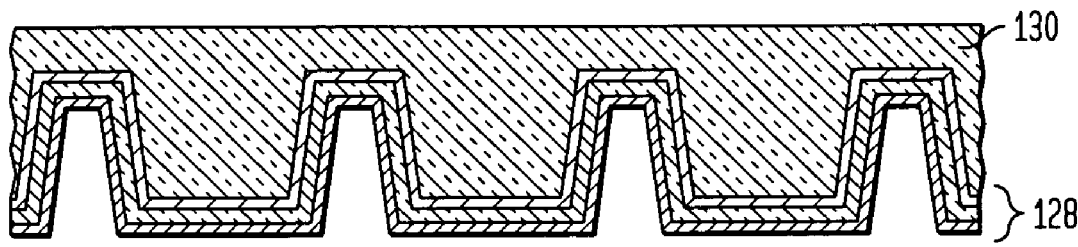
Figure 15:
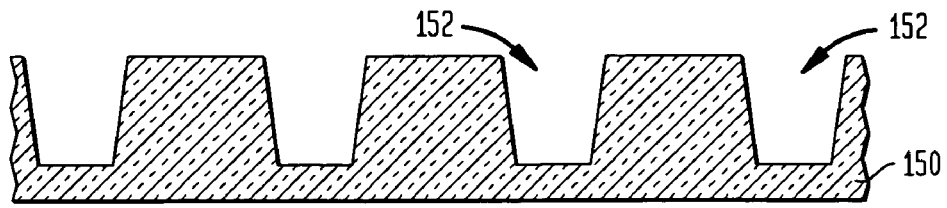
FIGS. 15 through 18 are cross-sectional drawings illustrating steps in a method of fabricating an enhanced surface area capacitor according to a second method embodiment of the invention.

Depending on whether a reusable mandrel 120, formed by processes described above with reference to FIGS. 6 through 9A, has been used as a surface for fabricating the layered capacitor stack structure 128, or whether layered capacitor stack 128 is formed on a mandrel 120 as a base designed to remain attached thereto, fabrication now proceeds according to one of several ways. If a reusable mandrel 120 has been used, process steps are now needed to form a base to which the layered capacitor stack 128 is to adhere, at which time mandrel 120 is removed from the layered capacitor stack 128. As shown in FIG. 13, a base 130 is then formed over second conductive layer 126, such that layered capacitor stack 128 is now attached to base 130. After the base 130 is formed, mandrel 120 is removed, as shown in FIG. 14, leaving the layered capacitor stack 128 attached to base 130. The removal of mandrel 120 is possible because of the low adhesion material layer formed earlier on the contact surface between mandrel 120 and the metal deposited to form the conformal first conductive layer 122.

However, if the layered capacitor stack 128 has been formed on a base 120 designed to remain attached, then only electrodes remain to be formed and connected to the plates of the capacitor provided by the first conductive layer 122 and the second conductive layer 126 of the layered capacitor stack 128. In either case, the base 130 can be formed by deposition of any one of several materials including dielectric materials, such as organic origin dielectrics among which are those categorized as having low dielectric constants known as "low-k" dielectrics such as polyimide and various other polymers. A preferred material for the base 120 is epoxy. Alternatively, inorganic dielectric materials can be used, such as silicon oxide, silicon nitride, silicon oxynitride, for example, which can be formed by any of several well-known methods, including chemical, vapor, plasma, and plasma-enhanced deposition and "spin-on" methods, e.g., for spin-on-glass, followed by subsequent hardening processes. Alternatively, the base 130, being attached to one plate of the capacitor formed by second conductive layer 126, can be formed of conductive material, depending upon the application to which the capacitor is employed. For example, if second conductive layer 126 is to be held at ground potential, base 130, to which it is attached, can be externally grounded. When the base 130 is formed of a conductive material, the capacitor structure can be insulated from unwanted electrical interaction by an insulator layer formed over parts of the base 130 and other exposed conductive elements.

While the above-described embodiment of a method of forming a capacitor is provided using a mandrel 120 having a surface including a plurality of protrusions, FIGS. 15 through 18 illustrate an alternative embodiment of the invention in which a capacitor is fabricated by forming a layered stack over a surface of a mandrel (or base) 150 having a plurality of depressions 152. Further, the above-described method embodiment can be combined with the method embodiment herein in a method in which a mandrel or base having both protrusions and depressions provides a surface upon which a capacitor structure is formed.

Figure 16:
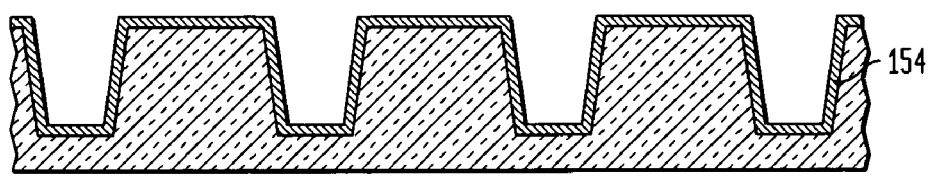
Figure 17:
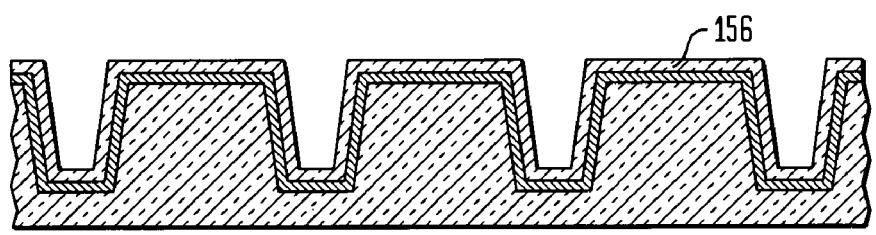
Figure 18:
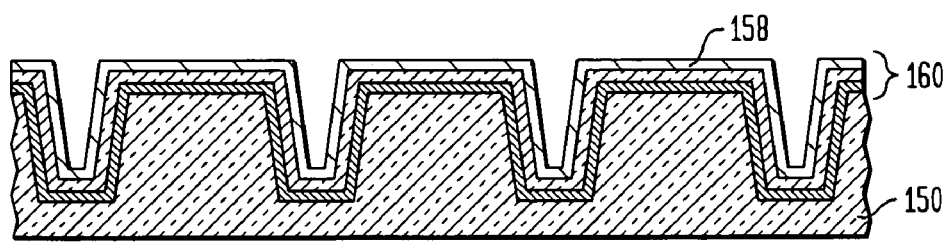

As shown in FIG. 16, a conformal first conductive layer 154 is deposited over the mandrel or base 150. Thereafter, as shown in FIG. 17, a capacitor dielectric layer 156 is formed over the conformal first conductive layer 154. When it is desired to form an electrolytic capacitor, the structure including base 150, conformal first conductive layer 154 and capacitor dielectric layer 156 are then placed in contact with an electrolyte contained in a vessel to form the electrolytic capacitor. However, when it is desired to form a plate capacitor, then, as shown in FIG. 18, a second conductive layer 158 is deposited to form a layered plate capacitor stack 160 including the conformal first conductive layer 154, capacitor dielectric layer 156, and second conductive layer 158. At this point, processing is similar to the method described above with reference to FIGS. 12, 13 and 14.

Figure 19:
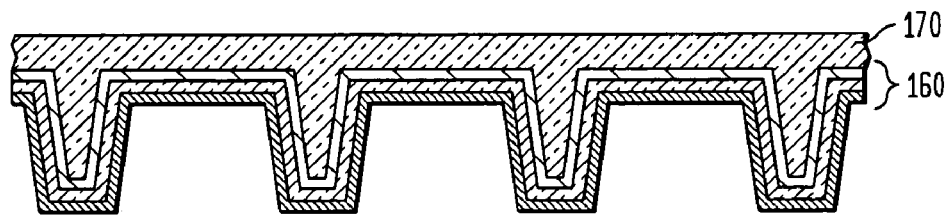
FIG. 19 is a cross-sectional drawing illustrating steps performed, subsequent to those illustrated in FIGS. 15 through 18, according to an alternative method embodiment of the invention.

Depending on whether a reusable mandrel 150, formed by processes described above with reference to FIGS. 6 through 9A, has been used as a surface for fabricating the layered capacitor stack structure 160, or a base 150 designed to remain attached is used, fabrication now proceeds according to one of several ways. If a reusable mandrel 150 has been used, process steps are now needed to form a base to which the layered capacitor stack 160 is to adhere, while mandrel 150 is removed from the layered capacitor stack 160. As shown in FIG. 19, a base 170 is formed over second conductive layer 158 such that layered capacitor stack 160 is now attached to base 170. After the base 170 is formed, mandrel 150 is removed, as shown in FIG. 19, leaving the layered capacitor stack 160 attached to base 170.

However, if the layered capacitor stack 160 has been formed on a base 150 designed to remain attached, then the capacitor formation process is complete, except only for electrodes (not shown) which remain to be formed and connected to the plates of the capacitor provided by the first conductive layer 154 and the second conductive layer 158 of the layered capacitor stack 160.

Thus, embodiments of enhanced surface area capacitor structures and methods of making them are provided and described herein. Such capacitor structures and methods meet the requirements for capacitors of large capacitance and smaller size of today's microelectronics industries.

As these and other variations and combinations of the features discussed above can be utilized, the foregoing description of the preferred embodiments should be taken by way of illustration, rather than by way of limitation of the invention, as defined by the claims.

What is claimed is:

1. A capacitor structure having increased surface area, comprising:
   a base including a surface having an array of features including at least one of: a plurality of first features protruding upward from said surface, or a plurality of second features extending downward from said surface, said array including at least two of said features arranged in a widthwise direction of said surface and at least two of said features arranged in a lengthwise direction of said surface, said lengthwise direction being transverse to said widthwise direction, each of at least some of said features having a predetermined first shape and having a predetermined first width in said widthwise direction and a predetermined first length in said lengthwise direction;
   a first conductive plate including a first conductive layer conforming to contours of said surface; and
   a conformal capacitor dielectric layer overlying said first conductive layer.

2. The capacitor structure of claim 1 further comprising a second conductive plate including a second conductive layer overlying said conformal capacitor dielectric layer.

3. The capacitor structure of claim 2 wherein said second conductive layer includes a low adhesion material selected from the group consisting of chromium, ruthenium, molybdenum, stainless steel and heavily doped polysilicon.

4. The capacitor structure of claim 1 wherein said features of said base include at least one of ridges or troughs.

5. The capacitor structure of claim 1 wherein said first shape is a substantially conical shape.

6. The capacitor structure of claim 1 wherein said first conductive layer includes a material selected from the group consisting of copper, aluminum, nickel, and tungsten.

7. The capacitor structure as claimed in claim 1, wherein either said predetermined width is substantially less than said predetermined length or said predetermined width is substantially greater than said predetermined length.

8. The capacitor structure as claimed in claim 1, wherein said first shape includes at least one shape selected from the group consisting of pyramidal frustum, paraboloid of revolution, and polyhedrons approximating surfaces of revolution.

9. The capacitor structure as claimed in claim 1, wherein said first shape includes at least one shape selected from the group consisting of ellipsoidal cap, elliptic conical frustum, and elliptic pyramidal frustum.

10. The capacitor structure as claimed in claim 1, wherein said first shape includes conical frustum.

11. The capacitor structure as claimed in claim 1, wherein said first shape includes pyramidal frustum.

12. The capacitor structure as claimed in claim 1, wherein said first shape includes at least one of a spheroidal cap or a spherical segment.

13. The capacitor structure as claimed in claim 1, wherein each of said at least some of said features further includes a second shape joined to said first shape, said second shape having a measure different from a corresponding measure of said first shape, said measure including at least one of an angle of a side wall of said feature, a height of said feature from said surface, a width in said widthwise dimension or a length in said lengthwise dimension.

14. The capacitor structure as claimed in claim 1, wherein said features include said first features and said second features.

15. The capacitor structure as claimed in claim 14, wherein said at least some features include a plurality of substantially planar feature surfaces and a plurality of rounded corners between adjacent ones of said plurality of substantially planar feature surfaces.

16. An electrolytic capacitor, comprising;
  a base including a surface having an array of features including at least one of: a plurality of first features protruding upward from said surface, or a plurality of second features extending downward from said surface, said array including at least two of said features arranged in a widthwise direction of said surface and at least two of said features arranged in a lengthwise direction of said surface, said lengthwise direction being transverse to said widthwise direction, each of at least some of said features having a predetermined first shape and having a predetermined first width in said widthwise direction and a predetermined first length in said lengthwise direction;
  a first plate including a first conductive layer conforming to contours and said features of said surface; and
  a conformal capacitor dielectric layer overlying said first conductive layer; and
  an electrolyte in contact with said conformal capacitor dielectric layer.

17. A capacitor structure having increased surface area, comprising:
  a base comprising epoxy, said base having a surface including an array of features, said features including at least one of: a plurality of first features protruding upward from said surface, or a plurality of second features extending downward from said surface, said array including at least two of said features arranged in a widthwise direction of said surface and at least two of said features arranged in a lengthwise direction of said surface transverse to said widthwise direction, each of at least some of said features having a predetermined first shape and having a predetermined first width in said widthwise direction and a predetermined first length in said lengthwise direction;
  a first plate including a first conductive layer conforming to contours and said features of said surface; and
  a conformal capacitor dielectric layer overlying said first conductive layer.

18. The capacitor structure of claim 17, wherein either said predetermined width is substantially less than said predetermined length or said predetermined width is substantially greater than said predetermined length.

19. The capacitor structure as claimed in claim 17, wherein said first shape includes at least one shape selected from the group consisting of pyramidal frustum, paraboloid of revolution, and polyhedrons approximating surfaces of revolution.

20. The capacitor structure as claimed in claim 17, wherein said first shape includes at least one shape selected from the group consisting of ellipsoidal cap, elliptic conical frustum, and elliptic pyramidal frustum.

21. The capacitor structure as claimed in claim 17, wherein said first shape includes conical frustum.

22. The capacitor structure as claimed in claim 17, wherein said first shape includes pyramidal frustum.

23. The capacitor structure as claimed in claim 17, wherein each of said at least some of said features further includes a second shape joined to said first shape, said second shape having a measure different from a corresponding measure of said first shape, said measure including at least one of an angle of a side wall of said feature, a height of said feature from said surface, a width in said widthwise dimension or a length in said lengthwise dimension.

24. The capacitor structure as claimed in claim 17, wherein said features include said first features and said second features.

25. The capacitor structure as claimed in claim 24, wherein said at least some features include a plurality of substantially planar feature surfaces and a plurality of rounded corners between adjacent ones of said plurality of substantially planar feature surfaces.

26. A capacitor structure having increased surface area, comprising:
  a base including a dielectric element having a surface including an array of features, said features including at least one of: a plurality of first features protruding upward from said surface, or a plurality of second features extending downward from said surface, said array including at least two of said features arranged in a widthwise direction of said surface and at least two of said features arranged in a lengthwise direction of said surface transverse to said widthwise direction, each of at least some of said features having a predetermined first shape and having a predetermined first width in said widthwise direction and a predetermined first length in said lengthwise direction;

a first plate including a first conductive layer conforming to contours and said features of said surface; and a conformal capacitor dielectric layer overlying said first conductive layer.

27. The capacitor structure of claim 26, further comprising a second plate including a second conductive layer overlying said conformal capacitor dielectric layer.

28. The capacitor structure of claim 27, wherein said features of said dielectric element include at least one of ridges or troughs.

29. The capacitor structure of claim 28, wherein said first shape is a substantially conical shape.

* * * * *